United States Patent
Quartiroli

(10) Patent No.: US 10,921,164 B2
(45) Date of Patent: Feb. 16, 2021

(54) INTEGRATED ELECTRONIC DEVICE INCLUDING A FULL SCALE ADJUSTMENT STAGE FOR SIGNALS SUPPLIED BY A MEMS SENSOR

(71) Applicant: STMICROELECTRONICS S.R.L., Agrate Brianza (IT)

(72) Inventor: Matteo Quartiroli, Broni (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 597 days.

(21) Appl. No.: 14/975,594

(22) Filed: Dec. 18, 2015

(65) Prior Publication Data
US 2016/0370207 A1 Dec. 22, 2016

(30) Foreign Application Priority Data
Jun. 18, 2015 (IT) .......................... UB2015A001481

(51) Int. Cl.
*G01D 5/56* (2006.01)
*B81B 7/00* (2006.01)

(52) U.S. Cl.
CPC ............... *G01D 5/56* (2013.01); *B81B 7/008* (2013.01)

(58) Field of Classification Search
CPC . B81B 7/008; G01D 5/56; H03M 1/18; G01P 2015/0882
See application file for complete search history.

(56) References Cited

U.S. PATENT DOCUMENTS

| 6,542,101 B1* | 4/2003 | Kolrsud | H03M 1/18 |
|---|---|---|---|
| | | | 341/118 |
| 7,474,247 B1* | 1/2009 | Heinks | A61N 1/3706 |
| | | | 341/143 |
| 2015/0268284 A1* | 9/2015 | Opris | G01P 15/125 |
| | | | 324/679 |

FOREIGN PATENT DOCUMENTS

JP 9-44185 A 2/1997

OTHER PUBLICATIONS

Italian Search Report and Written Opinion dated Jun. 18, 2015, for IT Application No. ITUB20151481, 7 pages.
Deligoz et al., "A MEMS-Based Power-Scalable Hearing Aid Analog Front End," *IEEE Transactions on Biomedical Circuits and Systems* 5(3):201-213, Jun. 2011.

* cited by examiner

*Primary Examiner* — Kyle R Quigley
(74) *Attorney, Agent, or Firm* — Seed IP Law Group LLP

(57) ABSTRACT

A MEMS sensor generates an output multiscale reading signal supplied to a full scale adjustment stage. The full scale adjustment stage includes a signal input configured to receive the reading signal, a saturation assessment block, and a full scale change block. The saturation assessment block is coupled to the signal input and configured to generate a scale increase request signal upon detection of a saturation condition. The full scale change block is coupled to the saturation assessment block and configured to generate a full scale change signal upon reception of the scale increase request signal.

24 Claims, 4 Drawing Sheets

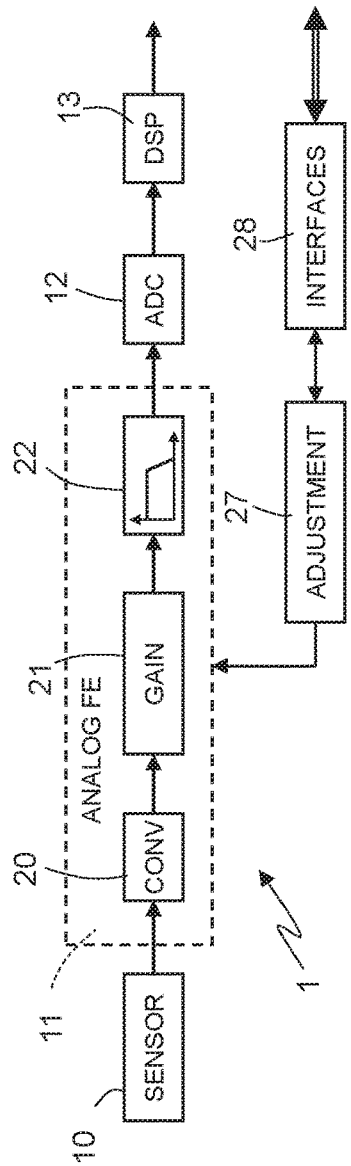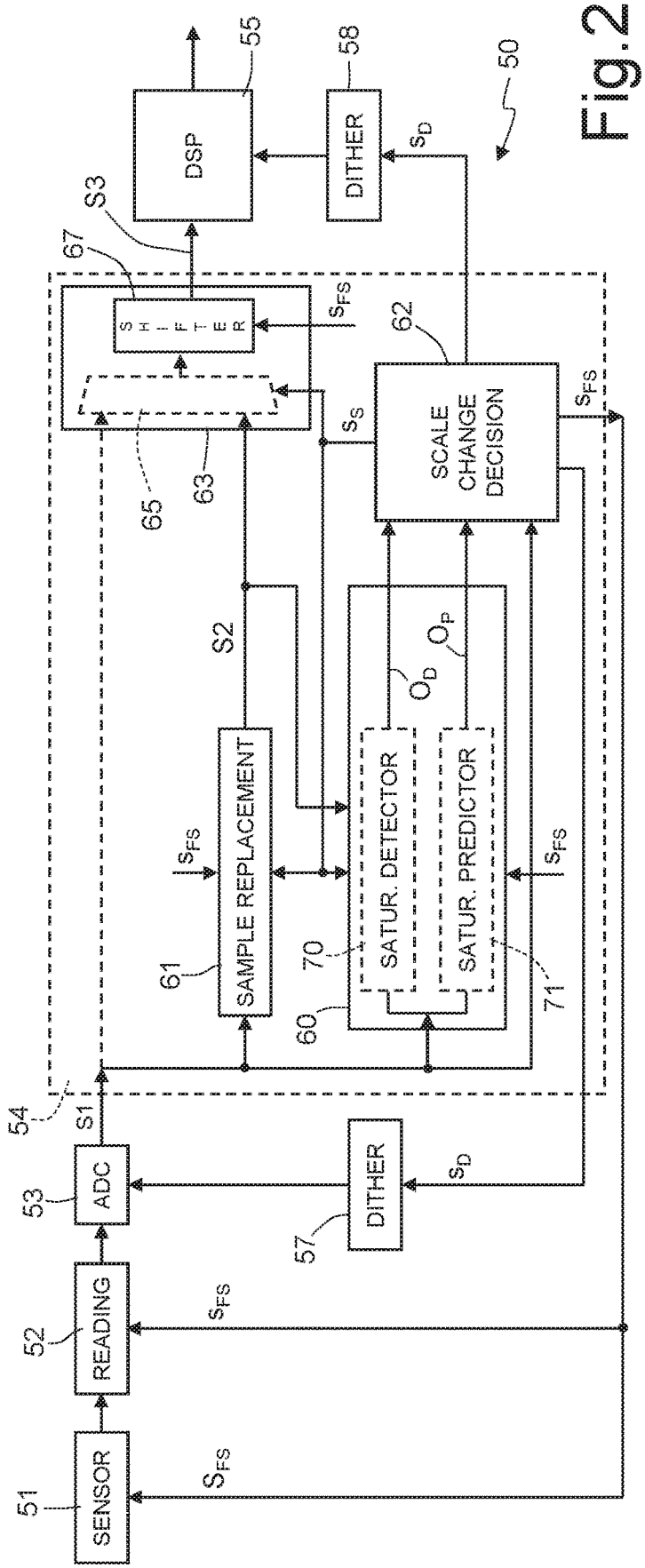

INTEGRATED ELECTRONIC DEVICE INCLUDING A FULL SCALE ADJUSTMENT STAGE FOR SIGNALS SUPPLIED BY A MEMS SENSOR

BACKGROUND

Technical Field

The present disclosure relates to an integrated electronic device including a full scale adjustment stage for signals supplied by a MEMS (Micro-Electro-Mechanical system) sensor produced using electronic micromachining techniques.

Description of the Related Art

As is known, MEMS sensors, and in general sensors that may be manufactured using electronic micromachining techniques, are able to detect a wide range of physical and chemical quantities, such as acceleration, velocity, weight, pressure, acoustic waves, chemicals, magnetic field, currents, etc., and are thus used in a wide range of applications, thanks to their versatility, small dimensions, and contained costs.

In general, these sensors comprise a micromachined sensor element integrated in a chip of semiconductor material, such as silicon, coupled to a reading stage (also referred to as "front-end stage"), normally including an amplification and filtering unit, which is in turn coupled, through an analog-to-digital conversion stage, to a signal-conditioning stage, which is generally application-specific.

Due to their numerous applications and the variety of working situations, the above micromachined sensors supply in general signals having multiple full scale values.

The full scale of these sensors, in addition to indicating an upper detectable value, is in general uniquely associated to the sensitivity of the sensors, the dynamic of an output signal whereof being fixed. In this case, an increase of the full scale determines a decrease of the sensitivity of the sensor (and vice versa), and a sensor having a reduced full scale has a high sensitivity (and vice versa). Change of the full scale thus enables adaptation of the sensitivity of the sensor to the amplitude of the signal to be detected.

The presence of different full scale values further prevents, in some cases, saturation of some components during reading or processing. For example, in some cases, the analog-to-digital conversion unit at the output may saturate in presence of noise components extraneous to the signal to be detected or when the analog part is configured to work with a linear dynamic for wider intervals than the full dynamic of the analog-to-digital converter.

Since the detection characteristics and, in general, the performance of the sensor depend upon the sensitivity, the apparatuses containing the sensor frequently include means for adjusting the sensitivity via full scale adjustment.

Currently, the sensitivity, and thus full scale, of the sensor is manually adjusted by the user on the basis of the application and the contingent requirements.

For a better understanding of the problems regarding adjustment of the sensitivity in systems of the type considered, reference be made to FIG. 1, which shows a block diagram of a sensing system 1.

In detail, the sensing system 1 comprises a sensor element 10, for example a MEMS sensor coupled to a reading stage 11 (also referred to as "front-end stage"), in turn coupled to an analog-to-digital conversion (ADC) stage 12, which supplies digitized samples to a digital-signal-processing (DSP) stage 13.

The reading stage 11 typically comprises a conversion unit 20, for example of a capacitance-to-voltage type in case of a sensor element 10 of a capacitive type, a gain-adjustment unit 21, and a filtering unit 22, cascade-connected to each other.

The reading stage 11 is further connected to an adjustment stage 27, in turn connected to interfaces 28 for exchanging information/controls with the outside (user).

In the sensing system 1, via the interfaces 28, a user may set the full scale value, which, through the adjustment stage 27, modifies the gain of the gain-adjustment unit 21, thus changing the full scale of the reading stage 11.

This type of adjustment is, however, disadvantageous. In fact, in case of fast modification of the dynamic of the signal, the risk of loss of information exists. In fact, in case of erroneous or in any case non-timely adjustment, use of an excessive full scale may entail a high approximation error in presence of low-dynamics signals. Instead, if the scale is excessively low, the risk of saturation of the downstream stages and signal distortion exists.

Further, the adjustment process may be flawed when the user does not have a full knowledge of the system, and in particular, is not able to correctly judge the scale to be used each time.

Finally, switching of the scale may entail a transient at each switching, thus determining a period of approximate operation of the sensor.

The subject matter discussed in the Background section is not necessarily prior art and should not be assumed to be prior art merely as a result of its discussion in the Background section. Along these lines, the recognition of one or more problems in the prior art discussed in the Background section and the subject matter associated therewith should not be treated as prior art unless expressly stated to be prior art. Instead, the discussion in the Background section encompassing one or more recognized problems in the prior art should be treated as part of the inventor's approach to the particular problem, which in and of itself may also be inventive.

BRIEF SUMMARY

Embodiments described in the present disclosure provide a full scale adjustment device that overcomes the drawbacks of the prior art.

In one embodiment, an electronic device for reading a micromachined sensor is provided, as defined in claim 1.

In one embodiment, the device comprises a saturation assessment block, which generates an appropriate warning when it detects or expects a saturation of the signal generated by the analog-to-digital converter, and a decision block, which assesses whether to modify or not the scale of the reading signal in the next cycle and possibly sends a full scale change control signal for the reading stage. In addition, the device may comprise a scaling block, for outputting an amplified digital signal that takes into account all the full scales that may be used in the reading stage.

The decision block may decide whether to change the scale immediately or wait. In addition, it may decide whether to replace the present sample with an appropriate value and activate dithering blocks for improving the performance of the sensing system on the basis of the full scale used.

BRIEF DESCRIPTION OF THE SEVERAL VIEWS OF THE DRAWINGS

Non-limiting and non-exhaustive embodiments are described with reference to the following drawings, wherein like labels refer to like parts throughout the various views unless otherwise specified. For a better understanding of the present disclosure, embodiments thereof are now described, purely by way of non-limiting example, with reference to the attached drawings, wherein:

FIG. 1 shows a block diagram of a sensing system using a micromachined sensor;

FIG. 2 shows a block diagram of a sensing system using the present scale-adjustment device;

DETAILED DESCRIPTION

Figure 3:
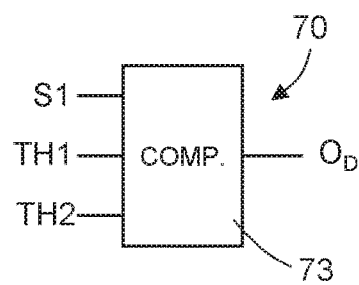
FIGS. 3-7 are block diagrams of components of the diagram of FIG. 2.

FIG. 2 shows a block diagram of a sensing system 50 using a sensor element 51 formed by micromachining substrates of semiconductor material, such as a MEMS sensor of the type discussed above.

The sensing system 50 further comprises a reading stage 52, similar to the corresponding stage 11 of FIG. 1, an analog-to-digital conversion (ADC) stage 53, similar to the corresponding ADC stage 12 of FIG. 1, a full scale adjustment stage 54, and a digital-signal-processing (DSP) stage 55, the latter being similar to the corresponding DSP stage 13 of FIG. 1. The sensing system 50 may also comprise dithering blocks 57, 58 coupled to the ADC stage 53 and to the DSP stage 55.

The full scale adjustment stage 54, which may be integrated in an own chip or integrated with the reading stage 52, the ADC stage 53 and/or the DSP stage 55, has the purpose of automatically detecting when a full scale change is to be carried out and generate appropriate control signals for the reading stage 52. In particular, the full scale adjustment stage 54 may operate by detecting saturation of the signal outputted by the ADC stage 53 and possibly intervening for changing the full scale. The full scale adjustment stage 54 may also comprise a mode for predicting the possibility of saturation and changing the full scale, so as to change the full scale in advance in order to prevent saturation and/or to check advisability of reducing the used full scale for improving the sensitivity of the sensing system.

The full scale adjustment stage 54 described hereinafter operates downstream of the ADC 53, on samples of the digitized reading signal S1 supplied by the ADC. Consequently, according to the context, hereinafter reference will be made indifferently to the digitized reading signal or to the samples thereof, which are both designated by S1, as for the signals processed by the full scale adjustment stage 54.

In detail, the full scale adjustment stage 54 comprises a saturation detector/predictor block 60; a sample replacement block 61; a decision block 62; and an alignment block 63.

The saturation detector/predictor block 60 has an input connected to the ADC stage 53, from which it receives the samples of the digitized reading signal S1, and outputs a saturation detection signal $O_D$ and a saturation prediction signal $O_P$ supplied to the decision block 62.

The saturation detector/predictor block 60 has the aim of warning and triggering the decision block 62 when it detects (on a current sample) or predicts (on a subsequent sample) saturation of the digitized reading signal S1.

The sample replacement block 61 is connected at its input to the ADC stage 53, from which it receives the samples of the digitized reading signal S1, and outputs replacement samples S2 of a value such as to reduce the error with respect to an (ideal) non-saturated output. The output of the sample replacement block 61 is coupled to the alignment block 63 as well as, optionally, to the saturation detector/predictor block 60.

The decision block 62 performs multiple functions, among which deciding when to change the full scale value and coordinating the other blocks 60, 61, 63. The decision block 62 connected to the ADC stage 53, from which it receives the samples of the digitized reading signal S1, and to the saturation detector/predictor block 60, from which it receives the detection and prediction saturation signals $O_D$ and $O_P$. The decision block 62 outputs a plurality of signals, among which:

a current full scale signal $s_{FS}$ supplied to the sensor element 51, to the reading stage 52, to the saturation detector/predictor block 60, to the sample replacement block 61, and to the alignment block 63;

a replacement control signal $s_S$ supplied to the alignment block 63, to the sample replacement block 61, and to the saturation detector/predictor block 60; and dithering signals $s_D$ supplied to the dithering blocks 57, 58, if provided, as described in greater detail hereinafter.

Specifically, the saturation detector/predictor block 60 may comprise a saturation detector element 70 and a saturation predictor element 71, both receiving the samples of the digitized reading signal S1 and outputting, respectively, the saturation detection signal $O_D$ and the saturation prediction signal $O_P$. As an alternative, in simpler applications, the saturation detector/predictor block 60 may comprise just the saturation detector element 70.

When the saturation detector/predictor block 60 has a complete structure, it attempts to predict when a subsequent sample of the digitized reading signal S1 may saturate in order to set an increase of the full scale such as to prevent likely saturation. If, however, it is not possible to prevent saturation (for example, owing to an estimation error, or because the signal detected by the sensor element 50 switches too fast) and the digitized reading signal S1 saturates, the saturation detector element 70 intervenes, issuing a warning that it is precisely the current sample that is the result of the saturation. Consequently, as explained in greater detail with reference to FIG. 9, in the complete structure, the saturation detector element 70 has precedence over the saturation predictor element 71, precisely because at that point the current saturation is a fact.

The saturation detector element 70 may be implemented via a simple comparator 73 that detects whether the digitized reading signal S1 is equal to one of the two extreme values TH1, TH2 of the sequence of bits that encodes the samples of the digitized reading signal S1, as shown in FIG. 3. For example, with the ADC stage 53 operating on 14 bits, the saturation detector element 70 checks whether the sample of the digitized reading signal S1 is equal to 0 or $2^{14}-1$ (in unsigned notation) and in this case outputs a preset logic condition of the saturation detection signal $O_D$.

Figure 10:
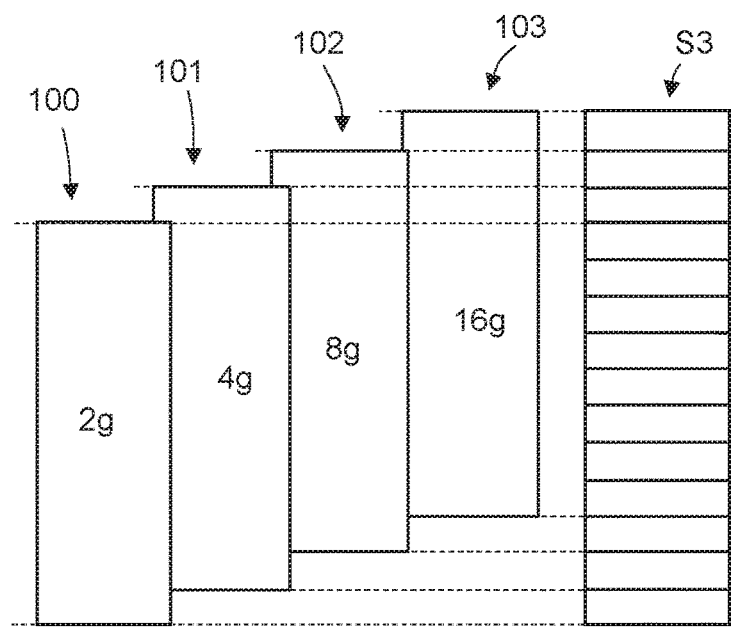
FIG. 10 shows the scaling obtainable with the system of FIG. 2.

Alternatively, it is possible to set a margin with respect to the extreme values indicated above for generating the logic saturation condition of the saturation detection signal $O_D$ even when the digitized reading sample S1 is only close to one of the extremes without, however, having reached it. In this situation, in fact, even a minor further displacement of the digitized reading signal S1 towards the extreme could cause saturation of the output of the ADC stage 53, thus increasing the likelihood of saturation occurring on the next sample. This is represented graphically in FIG. 10 where TH1 and TH2 may be equal to $S1_{MAX}$ and $S1_{min}$ or to $S1_{MAX}+\Delta$ and $S1_{min}-\Delta$.

The saturation predictor element 71 has the purpose of predicting whether the next sample of the digitized reading signal S1 will be saturated. To do this, it bases its operation on the past samples (stored in a suitable memory) and on the current sample of the digitized reading signal S1. Since each sample may be generated with a scale different from the other (past or future) samples, because of the change of scale, in order to be able to make the calculations, a normalization stage is provided that renders the data homogeneous.

Figure 4:
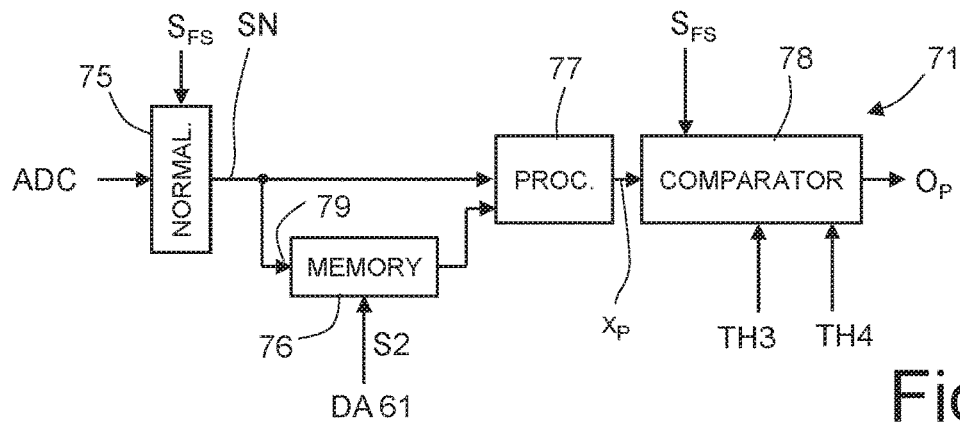

The saturation predictor element 71 may thus have the structure shown in FIG. 4 and comprise a normalization stage 75 receiving each sample of the digitized reading signal S1 and the current full scale signal $s_{FS}$. The normalization stage 75 thus generates a normalized sample SN supplied both to a memory 76 and to a prediction processing unit 77.

The memory 76 further receives the replacement sample S2 from the sample replacement block 61 and is connected at the output to the prediction processing unit 77.

The prediction processing unit 77 thus generates a predicted value $x_P$, in the way described in greater detail hereinafter.

The predicted value $x_P$ is supplied to a comparator 78, which compares it with two limit values TH3 and TH4 representing the extreme values of the dynamics referred to at the current scale or values that include a margin threshold, which may be different from that of the saturation detector element 70. On the basis of the outcome of the comparison, according to whether the predicted value $x_P$ is lower or higher than the threshold provided, the comparator 78 generates a corresponding logic value of the saturation prediction signal $O_P$.

The sample memory 76 may, for example, be a shift register, a FIFO (First-In-First-Out) memory or the like, provided with a plurality of outputs for always outputting the n most recent samples.

The prediction processing unit 77 may be implemented according to any of the many prediction methods and algorithms known in literature.

For example, a first order predictor could be used, which represents an excellent compromise between area, complexity, and effectiveness. As is known, this predictor computes the addition between the current sample and the difference between the last two samples, according to the following Eq. (1):

$$x[n+1]_P = x[n] + (x[n]-x[n-1]) = 2x[n]-x[n-1] \quad (1)$$

Figure 5:
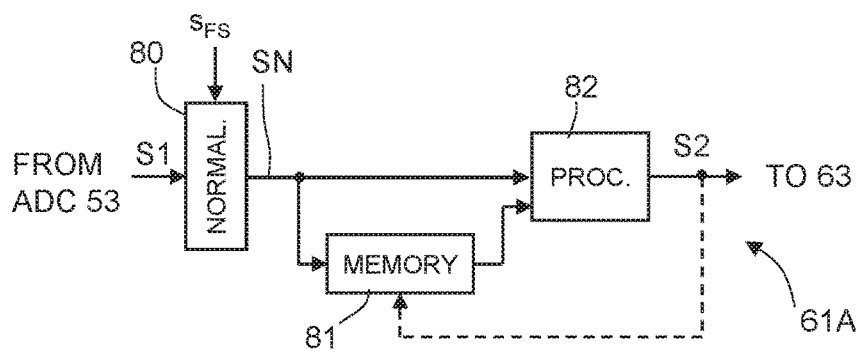
Figure 6:
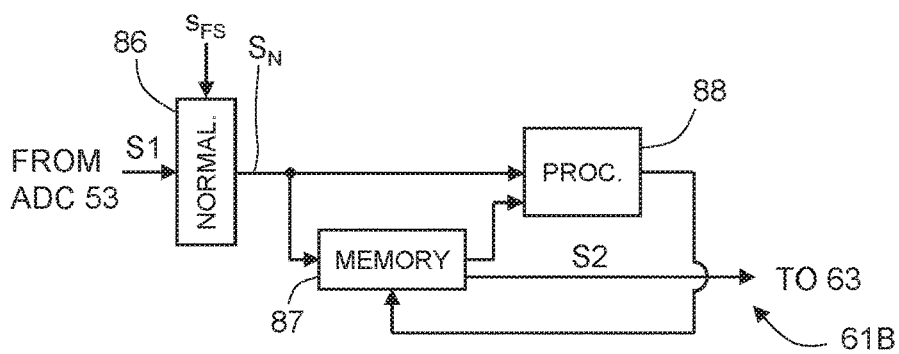

FIGS. 5 and 6 show two embodiments of the sample replacement block 61. This, as has been said, has the purpose of generating replacement samples S2 such as to reduce the error in case of saturation and may be implemented as a predictor (FIG. 5) or as an interpolator (FIG. 6).

In particular, if the sample replacement block 61 is implemented as a predictor (FIG. 5), the latter (which is here designated by 61A) may have a structure similar to the saturation predictor element 71 and thus comprises a normalization stage 80, a first sample memory 81, and a first replacement processing unit 82, connected as described above for the analogous blocks 75-77. In addition, the first sample memory 81 may have a second input connected to the output of the sample replacement block 61A for storing, instead of the scaled value supplied by the normalization stage 80, the replacement sample S2.

In this case, advantageously, the replacement sample S2 is already ready to be used since only the previous samples are considered to generate it, and thus the sample replacement block 61A does not introduce any delays. However, in some situations, this solution may generate samples that considerably depart from the ideal ones so that, according to the requirements, connection of the output of the first replacement processing unit 82 to the first sample memory 81 may be omitted.

If the sample replacement block 61 is implemented as an interpolator (FIG. 6), the latter (designated in this figure by 61B) does not base its operation only on the past samples for generating the replacement sample, but also uses the subsequent ones (the number whereof depends upon the architecture of the sample replacement block 61B). In this case, the saturated word is initially stored in memory and then replaced therein and outputted after an appropriate delay.

The sample replacement block 61B of FIG. 6 comprises a second normalization stage 86, a second sample memory 87, and a second replacement processing unit 88, connected as described above for the analogous blocks 80-82 of FIG. 5. In particular, in FIG. 6, the second sample memory 87 has a second input connected to the output of the second replacement processing unit 88 for storing, instead of the scaled value supplied by the second normalization stage 86, the replacement sample S2. In addition, the output of the second sample memory 87 forms the output of the sample replacement block 61B (connected to the alignment block 63 of FIG. 2), and the output of the second replacement processing unit 88 is connected only to the second sample memory 87.

The second replacement processing unit 88 may have various architectures and implementations. By way of example, a linear interpolator may be used, characterized by the following Eq. (2):

$$x[n-1]_I = \frac{x[n-2]+x[n]}{2} \quad (2)$$

This leads to a more precise estimation, also because, for the subsequent samples, the full scale change has already occurred by virtue of the saturation detector/predictor block 60; thus, these samples are no longer obtained in a saturation condition.

The solution of FIG. 6 has the advantage of considerably reducing the estimation error, against a delay of the output samples caused by waiting for the estimation samples.

In all the solutions of FIGS. 5 and 6, as said, some blocks are similar to corresponding blocks of the saturation predictor element 71 (scaling stage, sample memory, and prediction-processing element). Consequently, they may be implemented using the same hardware components in order to obtain a reduction of costs and size.

If saturation occurs, it may be useful for both the sample replacement block 61 and the saturation predictor element 71, if present, not to store the sample of the reading signal S1, which is by now saturated, but the replacement sample S2, in order to generate sufficiently accurate subsequent estimates. Consequently, the output of the sample replacement block 61 is connected to the sample memories 76 and 81 or 87 of FIGS. 4-6. However, this connection may be omitted, for example when the memory of predictors/interpolators is of just one sample, in which storage of the replacement sample would be useful only if two consecutive samples were to be saturated, a somewhat rare event.

The decision block 62 may predict a non-immediate change of full scale and, in this case, may comprise counters and registers to store the requests of change of full scale and the parameters that may affect the decision of increasing or decreasing the full scale.

Figure 7:
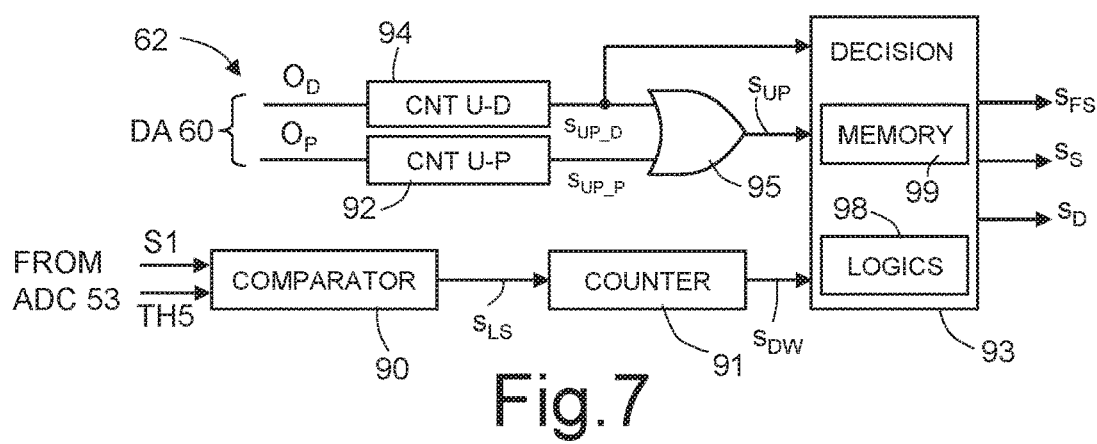

To this end, the decision block 62 may have the architecture shown in FIG. 7.

The scale change-decision block 62 of FIG. 7 waits for arrival of one or more requests of scale increase or decrease before intervening.

In detail, the decision block 62 comprises a decrease comparator 90, a decrease counter 91, a first increase comparator 92, a second increase comparator 94, an OR gate 95, and a logic stage 93 for full scale change decision. The logic stage 93 may comprise, for example, a logic unit 98 and a memory (such as a look-up table) 99.

Figure 9:
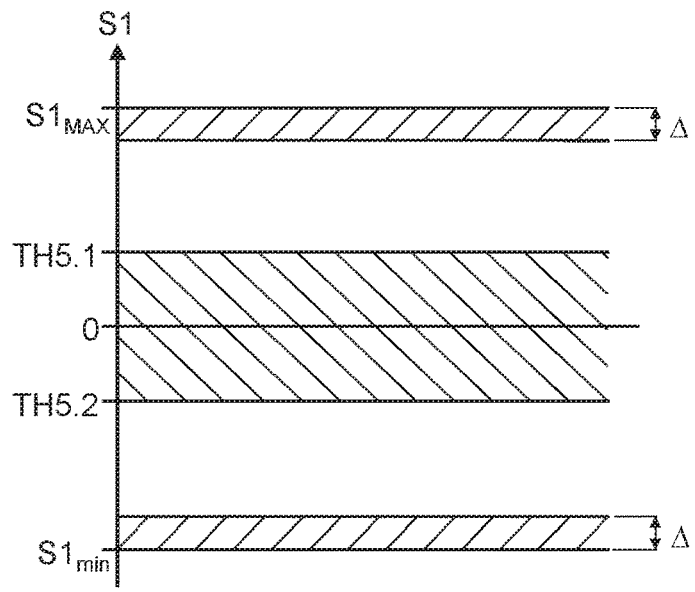
FIG. 9 shows the dynamics of the input signal and possible decision thresholds of the blocks of FIGS. 4-8.

The decrease comparator 90 receives the sample of the digitized reading signal S1 from the ADC block 53 and compares it with a threshold value TH5 that is preset or set by the user. For example, the threshold value TH5 may be a value close to zero (taking into account the sign); i.e., it may be close to half of the full scale value in the digitization used, as represented in FIG. 9, which shows an interval, delimited by the thresholds TH5.1 and TH5.2, where the decrease comparator 90 generates a low-sample signal $s_{LS}$.

The decrease counter 91 increments its value as it receives each low-sample signal $s_{LS}$ and generates a scale-decrease request $s_{DW}$ for the logic stage 93 when it receives a given number of low-sample signals $s_{LS}$, for example three or four.

The first increase comparator 92 receives the saturation prediction signal $O_P$ (in general, one bit) and counts it, supplying a prediction scale increase request signal $s_{UP\_P}$ upon detection of a given number of saturation prediction signals $O_P$. The second increase comparator 94 receives the saturation detection signal $O_D$ (also, in general, one bit) and counts it, supplying a detection scale increase request signal $s_{UP\_D}$, upon detection of a given number of saturation detection signals $O_D$, for example two or three, but even just one.

The OR gate 95 receives the detection scale increase request signal $s_{UP\_D}$ and the prediction scale increase request signal $s_{UP\_P}$ and generates a scale increase request for the logic stage 93 in presence of at least one of the above request signals $s_{UP\_D}$ and $s_{UP\_P}$.

The logic stage 93 also directly receives the detection scale increase request signal $s_{UP\_D}$.

Figure 8:
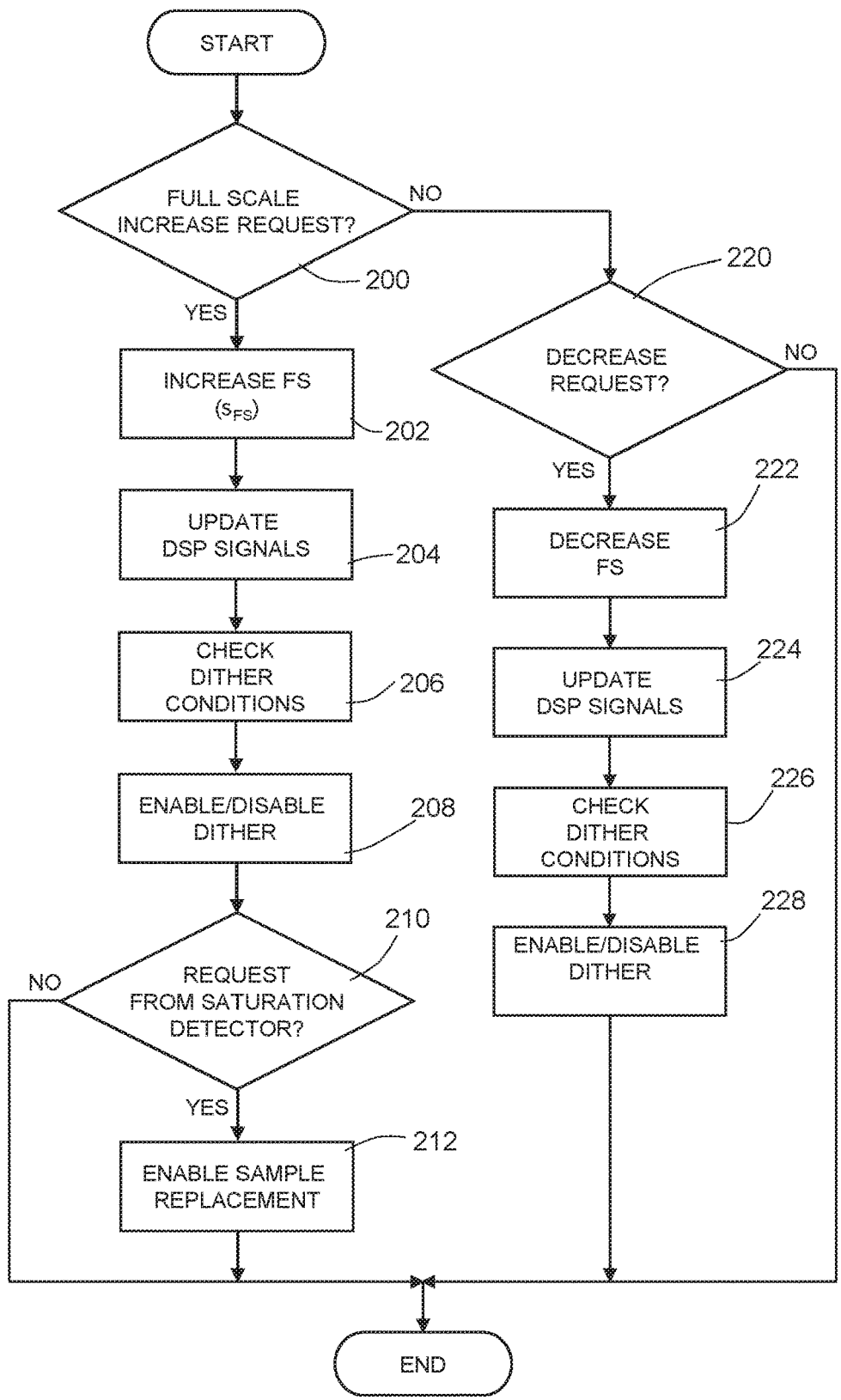
FIG. 8 is a flowchart illustrating the operations carried out by a block of FIG. 7.

As shown in the flowchart of FIG. 8, upon receiving a scale increase request $s_{UP}$ or the detection scale increase request signal $s_{UP\_D}$ (output Y from step 200), the logic stage 93 increases the full scale, updating the value of the current full scale signal $s_{FS}$ supplied to the reading stage 52 so that the latter may modify its own gain and take into account the current full scale (step 202). Further, the updated value of the current full scale signal $s_{FS}$ is generated and supplied to the saturation detector/predictor block 60 as well as to the sensor 51 for possible enabling of any compensation structures, for example for correcting any non-idealities such as cross axis. In addition, all the counters 91, 92, and 94 are reset.

Then, as described in detail below, the replacement control signal $s_S$ supplied to the alignment block 63 is updated (step 204), the dithering conditions are possibly checked in the memory 99, in a per se known manner (step 206), and the dithering signals $s_D$ are possibly sent to the dithering blocks 57, 58 (step 208).

Then, if the request for full scale increase is due to the detection of a saturation in progress (output Y from step 210), the sample replacement signal $s_S$ is supplied to the sample replacement block 61 and to the saturation detector/predictor block 60 (step 212).

Instead, if a scale-decrease request $s_{DW}$ has been received (output Y from step 220), the logic stage 93 reduces the full scale (step 222), updating the current full scale signal $s_{FS}$ and the compensation enabling signal $s_{SENS}$, and resetting all the counters 91, 92 and 96.

In addition, the replacement control signal $s_S$ supplied to the alignment block 63 is updated (step 224), the dithering conditions are possibly checked in the memory 99 (step 226); and the dithering signals $s_D$ are possibly sent to the dithering blocks 57, 58 (step 228).

According to a different embodiment (not shown), the increase counters 92, 94 may be omitted, and the logic stage 93 may modify the value of the current full scale signal $s_{FS}$ directly upon reception of one between the saturation detection signal $O_D$ and the saturation prediction signal $O_P$.

As may be noted, if, due to delays, the logic stage 93 receives both a scale increase request $s_{UP}$ and a scale-decrease request $s_{SW}$, scale increase request is prioritized, since it is better to increase the full scale "to no purpose" (and in the worst case make an error equal to 1 LSB) rather than saturate and obtain a much larger error.

As mentioned, when saturation is detected in step 212, the logic stage 93 issues a control for the alignment block 63 so that the latter selects the replacement sample S2 generated by the sample replacement block 61 and controls storing the replacement sample S2 instead of the normalized sample SN, through the replacement control signal $s_S$. As mentioned, if the sensing system 50 includes the dithering blocks 57, 58, it may generate dithering signals $s_D$ in steps 208 and 228. In fact, as known, the above blocks insert a small error for reducing the quantization error and thus improving performance both of the ADC stage 53 and of the DSP stage 55 and may be enabled in the event of a high full scale. The dithering signals $s_D$ thus provide for dithering enabling/disabling, in addition to supplying the information of the current full scale.

The alignment block 63 of FIG. 2, in addition to selecting the sample S1 or S2 to be sent to the DSP block 55 (when envisaged, through a multiplexer 65), scales the output sample as the full scale varies so that it is correctly aligned for the digital-processing chain downstream (DSP block 55), through a word-shifting unit (shifter) 67. To this end, the word-shifting unit 67 receives the current full scale signal $s_{FS}$ from the decision block 62. In particular, the word-shifting unit 67 converts the sample S1 or S2 into an extended sample S3, which may be processed by the DSP block 55 and has a greater number of bits. For example, with reference to FIG. 10, starting from the signal S1 or S2 generated using one of four possible different scales 100-103, each encoded, for example, via 14 bits, a 17-bit output signal S3 is generated. To this end, the word-shifting unit 67 may replicate the sign bit in the most-significant part (MSBs) of the extended sample S3, and fill with zeroes the least-significant part (LSBs).

The device described has the following advantages. It allows joining all the scales of the device in an automatic way for ensuring the improved dynamics for the signal, albeit maintaining the high sensitivity allowed by the dynamics. The joining is transparent to the stages downstream, which do not require modifications, apart from the capacity of working with a larger number of bits for the extended sample S3.

The full scale adjustment stage 50 may be applied to MEMS micromachined sensors of different types, for example motion sensors, such as accelerometers, gyroscopes, magnetometers, etc.

Finally, it is clear that modifications and variations may be made to the embodiments described and illustrated herein without thereby departing from the scope of the present disclosure.

For example, when the sample replacement block 61 is implemented as sample interpolator 61B (FIG. 6), the alignment block 63 might not be directly connected to the output of the ADC block 53. In fact, in this case, also the digitized reading sample S1 is delayed for consistency with the interpolated sample S2, and thus the replacement processing unit 82 and 88 may send directly, to the alignment block 63, the sample stored in the memory 81 or 87 (FIGS. 6 and 7). In this case, only the word-shifting unit 67 is present, which scales the sample, as described above.

Further, in the case of a multiaxial sensing system, it is possible to repeat some blocks of the diagram of FIG. 2, possibly with time sharing of resources.

In particular, in a multiaxial sensing system, it is possible to maintain a different full scale for each axis or have a single full scale for all the axes of the device. In the former case, since the axes are independent, the full scales are obtained independently of one another (unless some blocks are shared at different times). In the latter case (single full scale) it is sufficient to request change of the full scale of just one axis of the device to activate the procedure of assessment and possible change in the case of increase. Instead, the reduction of the full scale may be carried out only in presence of a request from all the axes. In this case, a decision block downstream of three decision blocks 62 in the three full scale change stages 54 manages change of the full scale, using a simple logic.

The various embodiments described above can be combined to provide further embodiments. The embodiments may include structures that are directly coupled and structures that are indirectly coupled via electrical connections through other intervening structures not shown in the figures and not described for simplicity. Aspects of the embodiments can be modified, if necessary to employ concepts of the various patents, applications and publications to provide yet further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device, comprising:
a signal input configured to receive a reading signal produced by a MEMS sensor device that is subject to saturation; and
circuitry coupled to the signal input and configured to:
generate a saturation detection signal based on the reading signal produced by the MEMS sensor device;
generate a saturation prediction signal that predicts when saturation will occur based on the reading signal produced by the MEMS sensor device; and
generate a full scale change signal based on the saturation detection signal and the saturation prediction signal, wherein the full scale change signal, in operation, is provided to the MEMS sensor device and directs the MEMS sensor device to adjust its full scale in accordance with the full scale change signal.

2. The electronic device according to claim 1, wherein the circuitry comprises:
a saturation detector.

3. The electronic device according to claim 2, wherein the saturation detector comprises:
a comparator configured to compare the reading signal with at least one saturation threshold value and further configured to generate the saturation detection signal based on the comparison of the reading signal with the at least one saturation threshold value.

4. The electronic device according to claim 1, wherein the circuitry comprises:
a saturation predictor configured to generate the saturation prediction signal.

5. The electronic device according to claim 4, wherein the saturation predictor is configured to
generate a normalized signal sample;
store a previous normalized signal sample;
generate a predicted signal sample based on the normalized signal sample and the previous normalized signal sample; and
generate the saturation prediction signal if the predicted signal sample exceeds at least one normalization limit threshold.

6. The electronic device according to claim 1 wherein the circuitry is configured to:
compare the reading signal with a decrease threshold; and
generate a scale-decrease request signal based at least in part on the comparison of the reading signal with the decrease threshold.

7. The electronic device according to claim 6, wherein the circuitry is configured to:
generate a full scale decrease request signal upon reception of a threshold number of scale decrease request signals.

8. The electronic device according to claim 6, wherein the circuitry is configured to:
generate a first scale increase request signal upon reception of a threshold number of saturation prediction signals.

9. The electronic device according to claim 8, wherein the circuitry is configured to:
generate a second scale increase request signal upon reception of a threshold number of saturation detection signals.

10. The electronic device according to claim 9, wherein the circuitry is configured to generate a full scale increase signal when the scale-decrease request signal and at least one of the first scale increase signal and the second scale increase signal is received.

11. The electronic device according to claim 1, wherein the circuitry is configured to:
output a replacement signal sample when a saturation condition of the reading signal is determined.

12. The electronic device according to claim 11, wherein the circuitry is configured to:
store a previous normalized signal sample; and
generate the replacement signal sample based on a normalized signal sample and the previous normalized signal sample.

13. The electronic device according to claim 11, wherein the circuitry is configured to:
store a normalized signal sample; and use interpolation to generate the replacement signal sample based on the normalized signal sample and the previous normalized signal sample.

14. The electronic device according to claim 11, wherein the circuitry is configured to:
amplify the replacement signal sample.

15. The electronic device according to claim 14, wherein the circuitry is configured to select the reading signal or the replacement signal sample.

16. The electronic device according to claim 1, wherein the reading signal is a digital signal and the circuitry is configured to process digital signals.

17. A sensing system, comprising:
a MEMS sensor having an input arranged to receive a full scale change signal and an output, wherein the MEMS sensor is arranged to adjust its full scale in accordance with the full scale change signal; and
signal processing circuitry coupled to the input and the output of the MEMS sensor and configured to:
generate an analog reading signal;
generate a digital reading signal based on the analog reading signal;
generate a saturation detection signal based on the digital reading signal;
generate a saturation prediction signal that predicts when saturation will occur based on at least one of the analog reading signal and the digital reading signal; and
generate the full scale change signal based on the saturation detection signal and the saturation prediction signal.

18. The sensing system according to claim 17, wherein the MEMS sensor element and a first portion of the circuitry are formed in a first integrated circuit and a second portion of the circuitry is formed in a second integrated circuit.

19. The sensing system according to claim 17, wherein the circuitry is configured to:
generate a replacement signal sample when a saturation condition of the digital reading signal is determined.

20. The sensing system according to claim 19, wherein the circuitry is configured to:
generate an amplified signal.

21. A sensing system method, comprising:
producing a digitized reading signal with a MEMS sensor device; and
providing an amplified reading signal based on a full scale adjustment of the digitized reading signal, the full scale adjustment including:
generating a saturation detection signal based on the digitized reading signal;
generating a saturation prediction signal that predicts when saturation will occur based on the digitized reading signal;
generating a replacement control signal based on a saturation assessment of the digitized reading signal, the saturation assessment being based on the saturation detection signal and the saturation prediction signal;
applying the replacement control signal to select either a replacement signal or the digitized reading signal for amplification;
converting the selected one of the replacement signal and the digitized reading signal into the amplified reading signal; and
feeding a full scale adjustment signal back to the MEMS sensor device, wherein the MEMS sensor device is arranged to adjust its full scale in accordance with the full scale change signal.

22. The sensing system method according to claim 21, wherein generating the replacement control signal comprises:
detecting when the digitized reading signal is outside of at least one saturation threshold value; and
producing, based on the detecting, the saturation detection signal.

23. The sensing system method according to claim 22, wherein generating the replacement control signal comprises:
normalizing the digitized reading signal to produce a normalized signal;
storing the normalized signal in a memory;
generating a predicted value based on the normalized signal and a previous normalized signal; and
comparing the predicted value to at least one normalization limit threshold; and based on the comparison of the predicted value to the at least one normalization limit threshold, producing the saturation prediction signal.

24. The sensing system method according to claim 22, wherein generating the replacement control signal comprises:
when the saturation prediction signal indicates saturation is predicted, producing a scale increase request based on the saturation detection signal and the saturation prediction signal;
when the saturation prediction signal does not indicate saturation is predicted, producing the scale increase request based on the saturation detection signal;
comparing the digitized reading signal to a full-scale threshold value;
based on the comparison of the digitized reading signal to the full-scale threshold value, producing a scale decrease request; and
logically combining the scale increase request and the scale decrease request to produce the replacement control signal.

* * * * *